United States Patent
Li et al.

(10) Patent No.: US 10,446,775 B2
(45) Date of Patent: Oct. 15, 2019

(54) ORGANIC LIGHT EMITTING ELEMENT, DISPLAY PANEL AND DISPLAY DEVICE

(71) Applicant: EverDisplay Optronics (Shanghai) Limited, Shanghai (CN)

(72) Inventors: Yanhu Li, Shanghai (CN); Xin Mou, Shanghai (CN)

(73) Assignee: EverDisplay Optronics (Shanghai) Limited, Shanghai (CN)

( * ) Notice: Subject to any disclaimer, the term of this patent is extended or adjusted under 35 U.S.C. 154(b) by 123 days.

(21) Appl. No.: 15/459,119

(22) Filed: Mar. 15, 2017

(65) Prior Publication Data
US 2018/0026219 A1 Jan. 25, 2018

(30) Foreign Application Priority Data
Jul. 22, 2016 (CN) .......................... 2016 1 0584613

(51) Int. Cl.
*H01L 51/50* (2006.01)
*H01L 27/32* (2006.01)
*H01L 51/00* (2006.01)

(52) U.S. Cl.
CPC ...... *H01L 51/5004* (2013.01); *H01L 27/3211* (2013.01); *H01L 27/3244* (2013.01); *H01L 51/0061* (2013.01); *H01L 51/0072* (2013.01); *H01L 51/504* (2013.01); *H01L 51/5056* (2013.01); *H01L 51/5072* (2013.01); *H01L 51/5088* (2013.01); *H01L 51/5092* (2013.01); *H01L 2251/552* (2013.01)

(58) Field of Classification Search
CPC .......................... H01L 51/5004; H01L 27/3211
See application file for complete search history.

(56) References Cited

U.S. PATENT DOCUMENTS

| | | | |
|---|---|---|---|
| 2013/0328029 A1* | 12/2013 | So | H01L 51/0059 257/40 |
| 2015/0014667 A1* | 1/2015 | Li | H01L 51/5096 257/40 |
| 2015/0162544 A1* | 6/2015 | Hwang | C07D 403/14 257/40 |

FOREIGN PATENT DOCUMENTS

| CN | 103325952 A | 9/2013 |
|---|---|---|
| CN | 104752615 A | 7/2015 |

OTHER PUBLICATIONS

The CN1OA issued by CNIPA dated Nov. 26, 2018.

* cited by examiner

*Primary Examiner* — Matthew E Warren
(74) *Attorney, Agent, or Firm* — Yunling Ren (57) ABSTRACT

The present disclosure relates to an organic element, a display panel and a display device. The organic light emitting element includes: a first electrode; a hole layer disposed on the first electrode; a light emitting layer including a first light emitting portion, a second light emitting portion and a third light emitting portion; an electron layer on the light emitting layer; and a second electrode disposed on the electron layer. An energy level difference between the hole layer and the first light emitting portion and/or an energy level difference between the first light emitting portion and the electron layer is greater than or equal to a first threshold, so that a turn-on voltage difference between the first light emitting portion and the second light emitting portion is smaller than a second threshold.

16 Claims, 7 Drawing Sheets

| Grey scale number | Brightness of panel /nits | Brightness of red sub-pixel /nits | Brightness of green sub-pixel /nits | Brightness of blue sub-pixel /nits |
|---|---|---|---|---|
| 0 | 0.02 | 0.24 | 0.74 | 0.06 |
| 4 | 0.05 | 0.61 | 1.84 | 0.16 |
| 8 | 0.14 | 1.71 | 5.15 | 0.43 |
| 12 | 0.32 | 3.90 | 11.78 | 0.99 |
| 16 | 0.59 | 7.20 | 21.71 | 1.83 |
| 20 | 0.94 | 11.47 | 34.59 | 2.92 |

Fig.1

Prior Art

ORGANIC LIGHT EMITTING ELEMENT, DISPLAY PANEL AND DISPLAY DEVICE

CROSS-REFERENCE TO RELATED APPLICATIONS

This application claims priority to Chinese Patent Application No. 201610584613.3, filed Jul. 22, 2016, the entire contents of which are incorporated herein by reference.

TECHNICAL FIELD

The present disclosure generally relates to display technologies, and more particularly to an organic light emitting element, a display panel and a display device.

BACKGROUND

Recently, Organic Light Emitting Diode (OLED) technologies have been developed rapidly, and have become one of the most promising technologies which can replace Liquid Crystal Displays (LCDs).

Figure 1:
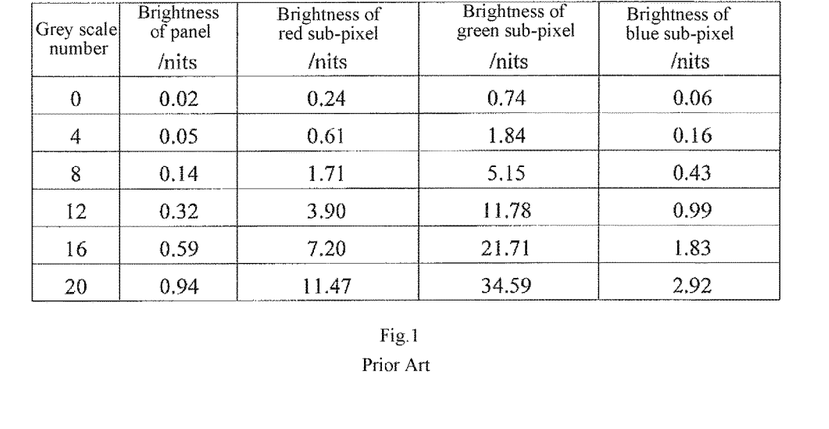
FIG. 1 illustratively shows brightnesses of a conventional OLED display panel under grey scales from 0 to 40 and brightnesses of red, green and blue sub-pixels.

FIG. 1 illustratively shows brightnesses of a conventional OLED display panel under grey scales from 0 to 40 and brightnesses of red, green and blue sub-pixels (the grey scale 255 corresponds to a brightness of 250 nits). As can be seen from FIG. 1, when the grey scale is relatively low (a low grey scale number), the brightness of the OLED display panel is quite low. For example, the brightness of the display panel when the grey scale number is 20 is only 0.94 nits, and the brightnesses of the red sub-pixel, the green sub-pixel and the blue sub-pixel are 11.47 nits, 34.59 nits, and 2.92 nits, respectively, in consideration of aperture ratios of individual pixels and the transmittance of the polarization sheet.

Figure 2:
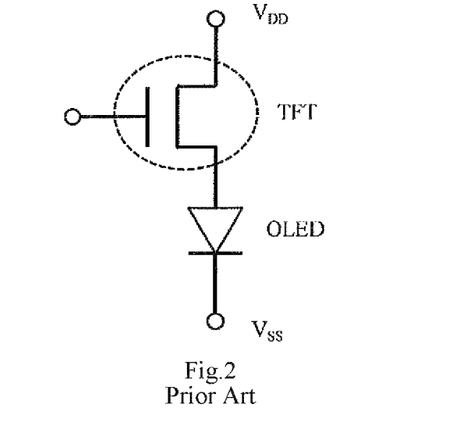
FIG. 2 is a schematic diagram illustratively showing a driving circuit for driving a conventional OLED display element.

FIG. 2 is a schematic diagram illustratively showing a driving circuit for driving a conventional OLED display element. In the example as shown in FIG. 2, the voltage between VDD and VSS is 7.1V; when the OLED display panel displays a low brightness such as 1 nit, although this is a low brightness, some voltage across the OLED display element still exists, and one of the red sub-pixel (R), the green sub-pixel (G) and the blue sub-pixel (B) in the OLED display element which has the lowest turn-on voltage will be turned on firstly under such voltage.

Figure 3:
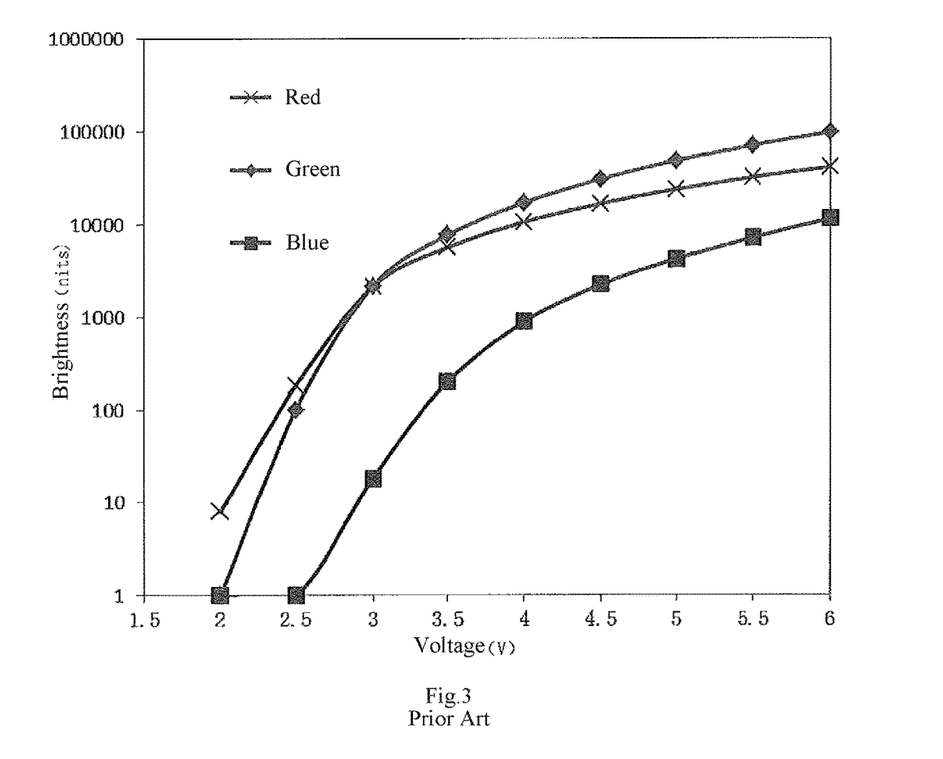
FIG. 3 is a voltage-brightness graph of the red, green and blue sub-pixels in conventional technologies.

FIG. 3 is a voltage-brightness graph of the red, green and blue sub-pixels. As can be seen from FIG. 3, in the conventional OLED display element, the turn-on voltage of the red, green and blue sub-pixels are not consistent. As shown in FIG. 3, the turn-on voltage of the blue sub-pixel is about 2.7V, which is higher than the turn-on voltage of the green sub-pixel, which is about 2V. The turn-on voltage of the green sub-pixel is higher than the turn-on voltage of the red sub-pixel which is about 1.7V.

Because of large red light spectrum, a difference between an energy level of a Highest Occupied Molecular Orbital (HOMO) and an energy level of a Lowest Unoccupied Molecular Orbital (LUMO) of the red light material in the light emitting layer of the red sub-pixel is relatively small, and thus the red sub-pixel is usually turned on first. Thus, the brightnesses of the red sub-pixel, the green sub-pixel and the blue sub-pixel cannot be mixed according to a ratio (for example, R:29.7%, G:60.9%, B:9.4%) by which white light can be realized. That is to say, the light obtained by mixing of the light from the red, green and the blue sub-pixels is not white light, and a color shift occurs, generally, a red shift.

In conventional technologies, the turn-on voltages of the BGR sub-pixels are different, and the turn-on voltages are relevant to the widths of the band gaps of the materials of the RGB light emitting layers. The low gray scale is the brightness under a low voltage, if the blue sub-pixel is turned on, even though the voltage mainly occurs across the blue sub-pixel, such voltage can be applied to the green and red sub-pixels via a hole layer due to the good conductivity of the hole layer. The turn-on voltage of the red sub-pixel is relatively low, and when the voltage drop across the hole layer is not big, the remaining voltage can activate emission of red light even with a part of the voltage missing. Thus, in the case of low grey scale, the brightness of the light emitted by the red sub-pixel cannot strictly meet the desired low brightness effect, and thereby the color under the low gray scale may become more red. Similarly, the turn-on voltage of the green sub-pixel is lower than the turn-on voltage of the blue sub-pixel, the color under low gray scale may become more green.

SUMMARY

Aiming at the shortcomings in the conventional technologies, the present disclosure provides an organic light emitting element, a display panel and a display device, which are capable of improving display effects.

According to an aspect of the present disclosure, there is provided an organic light emitting element, including: a first electrode; a hole layer disposed on the first electrode; a light emitting layer disposed on the hole layer and comprising a first light emitting portion, a second light emitting portion and a third light emitting portion; an electron layer disposed on the light emitting layer; and a second electrode disposed on the electron layer; wherein a difference of an energy level between that of the hole layer and the first light emitting portion and/or a difference of an energy level between that of the first light emitting portion and the electron layer is greater than or equal to a first threshold, so that a difference of a turn-on voltage between that of the first light emitting portion and the second light emitting portion is smaller than a second threshold.

According to an embodiment, the difference of the energy level between that of the hole layer and the first light emitting portion is a difference of an energy level of a highest occupied molecular orbital between that of the hole layer and the first light emitting portion.

According to an embodiment, the first light emitting portion, the second light emitting portion and the third light emitting portion emit different colors.

According to an embodiment, the difference of the energy level between that of the first light emitting portion and the electron layer is a difference of an energy level of a lowest unoccupied molecular orbital between that of the first light emitting portion and the electron layer.

According to an embodiment, the hole layer includes: a hole injection layer disposed on the first electrode; and a hole transporting layer disposed between the hole injection layer and the light emitting layer.

According to an embodiment, the difference of the energy level between that of the hole layer and the first light emitting portion is a difference of energy level between that of the hole transporting layer and the first light emitting portion.

According to an embodiment, the electron layer includes: an electron injection layer disposed on the light emitting layer; and an electron transporting layer disposed between the electron injection layer and the second electrode.

According to an embodiment, the difference of the energy level between that of the first light emitting portion and the electron layer is a difference of an energy level between that of the first light emitting portion and the electron transporting layer.

According to an embodiment, the electron layer is formed by 4,7-diphenyl-1,10-phenanthroline or 1,3,5-tris(1-phenyl-1H-benzimidazol-2-yl)benzene.

According to an embodiment, the hole layer is formed by 4,4',4''-tris(carbazol-9-yl)-triphenylamine, or N,N-diphenyl-N,N-[(1-naphthalenyl)-1,1'-biphenyl-4,4-diamine (NPD).

According to an embodiment, first light emitting portion is formed by 1,3-bis(carbazol)-9-yl-benzene or 10-hydroxy-benzo[H]quinoline.

According to an embodiment, the first threshold is from 0.2 eV to 0.4 eV.

According to an embodiment, an electron mobility of the first light emitting portion is smaller than an electron mobility of the second light emitting portion.

According to an embodiment, the electron mobility of the first light emitting portion is smaller than $10^{-3}$ cm$^2$/Vs.

According to an embodiment, the second threshold is from 0.4V to 0.6V.

According to an embodiment, a difference of an energy level between that of the hole layer and the third light emitting portion and/or a difference of an energy level between that of the third light emitting portion and the electron layer is greater than or equal to a third threshold, so that a difference of the turn-on voltage between that of the second light emitting portion and the third light emitting portion is smaller than a fourth threshold.

According to an embodiment, the third threshold is from 0.2 eV to 0.4 eV.

According to an embodiment, an electron mobility of the third light emitting device is smaller than the electron mobility of the second light emitting portion.

According to an embodiment, the electron mobility of the third light emitting portion is smaller than $10^{-3}$ cm$^2$/Vs.

According to an embodiment, the fourth threshold is from 0.4 V to 0.6 V.

According to another aspect of the present disclosure, there is provided a display panel, including the above organic light emitting element.

According to another aspect of the present disclosure, there is provided a display device, including the above display panel.

Embodiments of the present disclosure can have at least one of the following advantages over conventional technologies:

(1) The difference of an energy level between that of the hole layer and the first light emitting portion and/or the difference of an energy level between that of the first light emitting portion and the electron layer is greater than or equal to a first threshold, and thus the turn-on voltage of the first light emitting portion can be increased, and thereby the color shift of the red light under low gray scales can be improved.

(2) The difference of an energy level between that of the third light emitting portion and the hole layer and/or the difference of an energy level between that of the third light emitting portion and the electron layer is greater than or equal to the third threshold, and thus the turn-on voltage of the third light emitting portion can be increased, and thereby the turn-on voltages of the first light emitting portion, the second light emitting portion and the third light emitting portion become close to each other. Consequently, the color shift of the whole display under low gray scales can be improved.

(3) Each of the electron motilities of the first light emitting portion and the third light emitting portion is smaller than the electron mobility of the second light emitting portion, and thus the turn-on voltages of the first light emitting portion, the second light emitting portion and the third light emitting portion can be further homogenized.

BRIEF DESCRIPTION OF THE DRAWINGS

The above and other features and advantages of the present disclosure will become clearer from the description of exemplary embodiments with reference to drawings.

DETAILED DESCRIPTION

Now, exemplary implementations will be described more comprehensively with reference to the accompanying drawings. However, the exemplary implementations may be carried out in various manners, and should not be interpreted as being limited to the implementations set forth herein; instead, providing these implementations will make the present disclosure more comprehensive and complete and will fully convey the conception of the exemplary implementations to the ordinary skills in this art. Throughout the drawings, the like reference numbers refer to the same or the like structures, and repeated descriptions will be omitted.

The features, structures or characteristics described herein may be combined in one or more embodiments in any suitable manner. In the following descriptions, many specific details are provided to facilitate sufficient understanding of the embodiments of the present disclosure. However, one of ordinary skills in this art will appreciate that the technical solutions in the present disclosure may be practiced without one or more of the specific details, or by employing other methods, components, materials and so on. In other conditions, well-known structures, materials or operations are not shown or described in detail so as to avoid confusion of respective aspects of the present disclosure.

The drawings of the present disclosure are used for illustrating relatively position relationships, and the sizes of elements in the drawings do not represent actual ratio or sizes.

In order to solve the color shift under low gray scales in conventional technologies, the present disclosure provides an organic light emitting element, a display panel and a display device. The organic light emitting element, the display panel and the display device provided by the present disclosure will be described below with reference to FIGS. 4 to 7.

Figure 4:
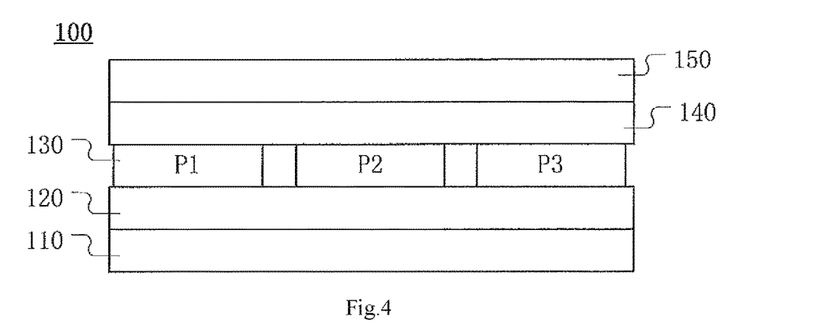
FIG. 4 is a schematic diagram of an organic light emitting element according to an embodiment of the present disclosure.
Figure 5:
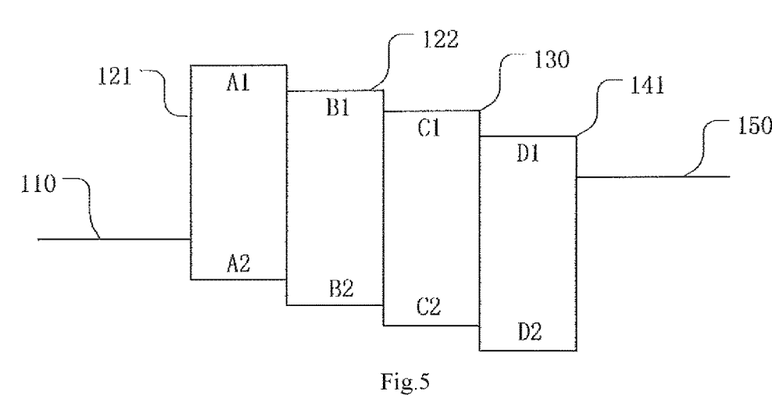
FIG. 5 is an equivalent circuit diagram of the organic light emitting element according to the embodiment of the present disclosure.

Firstly, the organic light emitting element provided by the present disclosure will be described with reference to FIGS. 4 to 5. The organic light emitting element 100 includes a first electrode 110, a hole layer 120, a light emitting layer 130, an electron layer 140 and a second electrode 150.

The first electrode 110 and the second electrode 150 are opposite to each other. According to an embodiment, the first electrode 110 can be an anode, and the second electrode 150 can be a cathode, and the organic light emitting element 100 can be a cathode emission type organic light emitting element or an anode emission type organic light emitting element. For example, for a cathode emission type organic light emitting element 100, the anode 110 can be a total reflection anode electrode, which can be metal having high reflectance or an alloy thin film electrode, for example, Ag electrode, Ag alloy electrode, Al electrode, Al alloy electrode, Cu electrode, Cu alloy electrode, Pt electrode, or Pt alloy electrode. The cathode 150 can be a transparent electrode which can be formed by transparent materials such as ITO, IZO, AZO, ZTO, Al and a thin film of an Al alloy, Mg and a thin film of a Mg alloy, Ag and a thin film of an Ag alloy, and the like. Similarly, one of ordinary skill in this art can conceive an anode emission type organic light emitting element 100.

The hole layer 120, the light emitting layer 130 and the electron layer 140 are sequentially disposed between the first electrode 110 and the second electrode 150. According to an embodiment, the hole layer 120 includes a hole injection layer 121 disposed on the first electrode 110 and a hole transporting layer 122 disposed on the hole injection layer 121. In some other embodiments, the hole layer 120 can only include the hole transport layer 122. The present disclosure does not impose limitations on the number of the hole injection layer 121 and the hole transporting layer 122, and one of ordinary skill in this art can conceive many modified examples according to actual application scenarios of the organic light emitting element 100, and detailed descriptions are omitted here.

According to an embodiment, the electron layer 140 includes an electron transporting layer 141 disposed on the light emitting layer 130 and an electron injection layer disposed on the electron transporting layer 141. In some other embodiments, the electron layer 140 can only include the electron transport layer 141. The present disclosure does not impose limitations on the number of the electron injection layer and the electron transporting layer 141, and one of ordinary skill in this art can conceive many modified examples according to actual application scenarios of the organic light emitting element 100, and detailed descriptions are omitted here.

The light emitting layer 130 is disposed between the hole layer 120 and the electron layer 140. The light emitting layer 130 includes a plurality of light emitting portions which emit different colors. For example, the light emitting layer 130 includes a first light emitting portion P1 which may emit red light, a second light emitting portion P2 which may emit blue light, and a third light emitting portion P3 which may emit green light. With respect to the first light emitting portion P1 which emits the light of the first color, a difference of an energy level between that of the hole layer 120 and the first light emitting portion P1 and/or a difference of an energy level between that of the first light emitting portion P1 and the electron layer 140 is greater than or equal to a first threshold, so that a difference of a turn-on voltage between that of the first light emitting portion P1 and the second light emitting portion P2 is smaller than a second threshold. The first threshold can be from 0.2 eV to 0.4 eV. According to an embodiment, the first threshold can be 0.3 eV. According to an embodiment, the second threshold can be from 0.4V to 0.6V.

Specifically, the difference of the energy level between that of the hole layer 120 and the first light emitting portion P1 refers to a difference of an energy level between that of the hole transporting layer 122 and the first light emitting portion P1. Further, the difference of an energy level between that of the hole transporting layer 122 and the first light emitting portion P1 is a difference between an energy level B2 of a HOMO of the hole transporting layer 122 and an energy level C2 of a HOMO of the first light emitting portion P1.

The difference of the energy level between that of the first light emitting portion P1 and the electron layer 140 refers to a difference of the energy level between that of the first light emitting portion P1 and the electron transporting layer 141. Further, the difference of the energy level between that of the first light emitting portion P1 and the electron transporting layer 141 is a difference between an energy level C1 of a LUMO of the first light emitting portion P1 and an energy level D1 of a LUMO of the electron transporting layer 141.

Some examples of the organic light emitting element provided by the present disclosure will be described below with reference to FIG. 5.

First Example

The organic light emitting element includes the anode 110, the hole injection layer 121, the hole transporting layer 122, the light emitting layer 130 (the first light emitting portion P1 is shown), the electron transporting layer 141 and the cathode 150. The first threshold is 0.3 eV.

The hole transporting layer 122 is formed by a material such as 4,4',4"-tris(carbazol-9-yl)-triphenylamine, or N,N-diphenyl-N,N-[(1-naphthalenyl)-1,1'-biphenyl-4,4-diamine (NPD). The first light emitting portion is formed by a material such as 1,3-bis(carbazol)-9-yl-benzene or 10-hydroxybenzo[H]quinoline. The electron transporting layer 141 is formed by a material such as 4,7-diphenyl-1,10-phenanthroline or 1,3,5-tris(1-phenyl-1H-benzimidazol-2-yl)benzene.

The energy level B2 of the HOMO of the hole transporting layer 122 is 5.2 eV. The energy level C2 of the HOMO of the first light emitting portion P1 is 5.8 eV. The difference between the energy level B2 of the HOMO of the hole transporting layer 122 and the energy level C2 of the HOMO of the first light emitting portion is 0.6 eV, which is greater than the first threshold. The energy level C1 of the LUMO of the first light emitting portion is 2.5 eV. The energy level D1 of the LUMO of the electron transporting layer 141 is 3.0 eV. The difference between the energy level C1 of the LUMO of the first light emitting portion and the energy level D1 of the LUMO of the electron transporting layer 141 is 0.5 eV, which is greater than the first threshold. One of ordinary skill in this art can appreciate that the energy levels of the materials of layers are determined by the effective conjugation lengths of the molecules of the materials. Specifically, if the effective conjugation length of the molecule of a material is long, the difference between the energy level of the HOMO and the energy level LUMO of the material is small; if the effective conjugation length of the molecule of a material is short, the difference between the energy level of the HOMO and the energy level of LUMO of the material is large. The materials of the above layers can be selected according to the effective conjugation lengths of the molecules of the materials and detailed descriptions thereof will be omitted here.

Second Example

The structure of the organic light emitting element in this example is similar to that in the first example except that the energy levels of individual layers are different from that in the first example. For example, the energy level B2 of the HOMO of the hole transporting layer 122 is 5.5 eV. The energy level C2 of the HOMO of the first light emitting portion P1 is 5.6 eV. The difference between the energy level B2 of the HOMO of the hole transporting layer 122 and the energy level C2 of the HOMO of the first light emitting portion is 0.1 eV, which is not greater than the first threshold. The energy level C1 of the LUMO of the first light emitting portion is 2.6 eV. The energy level D1 of the LUMO of the electron transporting layer 141 is 3.0 eV. The difference between the energy level C1 of the LUMO of the first light emitting portion and the energy level D1 of the LUMO of the electron transporting layer 141 is 0.4 eV, which is greater than the first threshold. The materials of individual layers in this example can be the same as that in the first example.

Third Example

The structure of the organic light emitting element in this example is similar to that in the first example except that the energy levels of individual layers are different from that in the first example. The energy level B2 of the HOMO of the hole transporting layer 122 is 5.2 eV. The energy level C2 of the HOMO of the first light emitting portion P1 is 5.8 eV. The difference between the energy level B2 of the HOMO of the hole transporting layer 122 and the energy level C2 of the HOMO of the first light emitting portion is 0.6 eV, which is greater than the first threshold. The energy level C1 of the LUMO of the first light emitting portion is 2.6 eV. The energy level D1 of the LUMO of the electron transporting layer 141 is 2.7 eV. The difference between the energy level C1 of the LUMO of the first light emitting portion and the energy level D1 of the LUMO of the electron transporting layer 141 is 0.1 eV, which is not greater than the first threshold. The materials of individual layers in this example can be the same as that in the first example.

According to the background as mentioned above, the turn-on voltage of the red sub-pixel is the lowest, and the turn-on voltage of the first light emitting portion which emits red light can be increased by the energy levels of individual layers which are set as mentioned above. After the turn-on voltage of the first light emitting portion which emits red light is increased, the turn-on voltage of the third light emitting portion which emits green light become the lowest among all the light emitting portions, and thus the third light emitting portion can be processed similarly. In other words, with respect to the third light emitting portion which emits light of the third color, a difference of an energy level between that of the hole layer and the third light emitting portion and/or a difference of an energy level between that of the third light emitting portion and the electron layer is greater than or equal to a first threshold, so that a difference of a turn-on voltage between that of the second light emitting portion and the third light emitting portion is smaller than a fourth threshold. According to an embodiment, the fourth threshold can be 0.4V to 0.6V. According to an exemplary embodiment, only the difference between the energy level of the hole layer and the energy level of the third light emitting portion or the difference between the energy level of the third light emitting portion and the energy level of the electron layer is greater than or equal to the first threshold, so that the turn-on voltages of the first light emitting portion, the second light emitting portion and the third light emitting portion can become close to each other.

In addition, the organic light emitting element is an electroluminescent element, and the equivalent circuit of the organic light emitting element can be resistors, inductors, capacitors and light emitting materials (that is, light emitting layers) being disposed between a positive electrode and a negative electrode, and thus the mobilities of the light emitting materials can directly influence the serial resistance of the organic light emitting element. In a modified embodiment of the above embodiments, the electron mobility of the first light emitting portion P1 can be smaller than the electron mobility of the second light emitting portion P2, so that the serial resistance can be increased. Consequently, the turn-on voltage of the first light emitting portion P1 can be increased to improve the color shift under low gray scales. According to an exemplary embodiment, the electron mobility of the first light emitting portion P1 is smaller than $10^{-3}$ $cm^2/Vs$. For example, materials having poor conjugation level such as Be(PP): 10-hydroxybenzo[H]quinoline or Alq3: 8-hydroxyquinoline aluminum salt can be selected to improve low electron mobility of the light emitting portion. Similarly, the electron mobility of the third light emitting portion P3 can be smaller than the electron mobility of the second light emitting portion P2. For example, the electron mobility of the third light emitting portion P3 can be smaller than $10^{-3}$ $cm_2/Vs$ so that the turn-on voltage of the third light emitting portion P3 can be increased and thereby the turn-on voltages of the first light emitting portion, the second light emitting portion and the third light emitting portion can be further homogenized.

Figure 6:
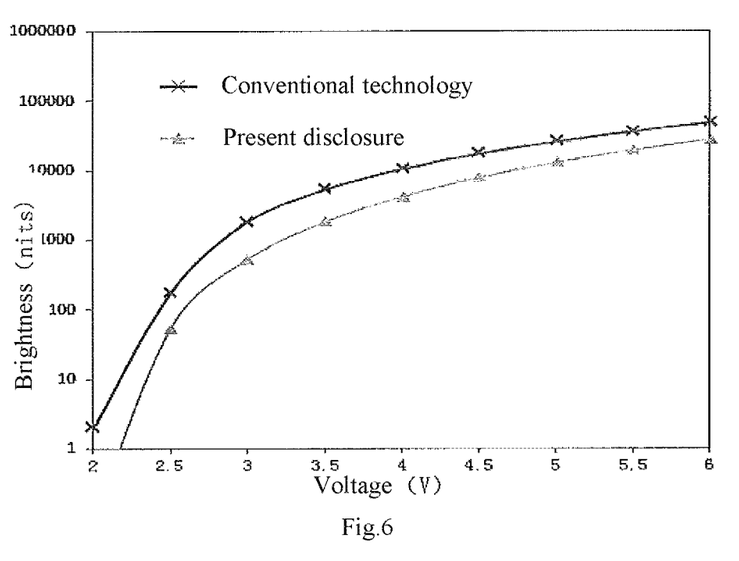
FIG. 6 shows comparison between voltage-brightness graphs of the first light emitting portion in conventional technologies and the present disclosure.

FIG. 6 illustratively shows a voltage-brightness graph of the first light emitting portion of the organic light emitting element provided by the present disclosure and a voltage-brightness graph of the first light emitting portion of the organic light emitting element in conventional technologies. As can be clearly seen from FIG. 6, the turn-on voltage of the first light emitting portion provided by the present disclosure is increased, and thus the display problem of color shift under low gray scales is improved.

Figure 7:
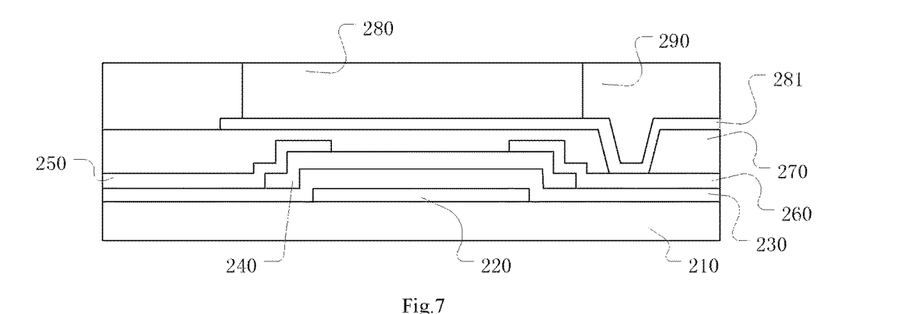
FIG. 7 is a schematic diagram of a display panel according to an embodiment of the present disclosure.

According to another aspect of the present disclosure, there is provided a display panel, as shown in FIG. 7. The display panel shown in FIG. 7 includes a substrate 210. Thin Film Transistor (TFT) elements are disposed on the substrate 210. Each of the TFT element can include a gate 220, a gate insulation layer 230, an active layer 240, a source 250 and a drain 260 sequentially formed on the substrate 210. A planarization layer 270 is disposed on the TFT element (i.e., on the source 250 and the drain 260).

The planarization layer 270 has an opening provided therein to enable the anode 281 of the organic light emitting element 280 to be connected with the drain 260. The structure of the organic light emitting 280 is as shown in FIG. 4, and the anode 281 of the organic light emitting element 280 is in contact with the drain 260 via the opening. A pixel defining layer 290 is provided among the organic light emitting elements 280.

Specifically, the exemplary embodiment as shown in FIG. 7 provides a display panel including bottom-gate type TFT elements. One of ordinary skill in this art can conceive many modified embodiments of display panel structures according to TFT elements of different structures, for example, some layers can be omitted or added according to actual requirements and detailed descriptions thereof are omitted here.

According to another aspect of the present disclosure, there is provided a display device including the above display panel. The display device can be an individual screen, or an electronic device integrated with a processor, for example a mobile phone, a tablet and the like. One of ordinary skill in this art can realize different display devices, and detailed descriptions thereof are omitted here.

Embodiments of the present disclosure has at least one of the following advantages over conventional technologies:

(1) The difference of the energy level between that of the first light emitting portion which for example may emit red light and the hole layer and/or the difference of the energy level between that of the first emitting portion and the electron layer is greater than or equal to the first threshold, and thus the turn-on voltage of the first light emitting portion can be increased, and thereby the color shift of the red light under low gray scales can be improved.

(2) The difference of the energy level between that of the third light emitting portion which for example may emit green light and the hole layer and/or the difference of the energy level between that of the third light emitting portion and the electron layer is greater than or equal to the third threshold, and thus the turn-on voltage of the third light emitting portion can be increased, and thereby the turn-on voltages of the first light emitting portion, the second light emitting portion and the third light emitting portion become close to each other. Consequently, the color shift of the whole display under low gray scales can be improved.

(3) Each of the electron motilities of the first light emitting portion and the third light emitting portion is smaller than the electron mobility of the second light emitting portion, and thus the turn-on voltages of the first light emitting portion, the second light emitting portion and the third light emitting portion can be further homogenized.

Exemplary embodiments of the present disclosure are described above. It should be appreciated that the present disclosure is not limited to the disclosed embodiments. Instead, the present disclosure is intended to encompass various modifications and equivalent replacements within the scope as defined by the appended claims.

What is claimed is:

1. An organic light emitting element, comprising:
a first electrode;
a hole layer disposed on the first electrode;
a light emitting layer disposed on the hole layer and comprising a red light emitting portion, a blue light emitting portion and a green light emitting portion;
an electron layer disposed on the light emitting layer; and
a second electrode disposed on the electron layer;
wherein a difference of an energy level between that of the hole layer and the red light emitting portion and/or a difference of an energy level between that of the red light emitting portion and the electron layer is greater than or equal to a first threshold which is from 0.2 eV to 0.4 eV, and a difference of an energy level between that of the hole layer and the green emitting portion and/or a difference of an energy level between that of the green emitting portion and the electron layer is greater than or equal to a third threshold which is from 0.2 eV to 0.4 eV, so that turn-on voltages of the red light emitting portion, the blue emitting portion and the green emitting portion are close to each other to avoid color shift under low gray scales.

2. The organic light emitting element according to claim 1, wherein the difference of the energy level between that of the hole layer and the red light emitting portion is a difference of an energy level of a highest occupied molecular orbital between that of the hole layer and the red light emitting portion.

3. The organic light emitting element according to claim 1, wherein the difference of the energy level between that of the red light emitting portion and the electron layer is a difference of an energy level of a lowest unoccupied molecular orbital between that of the red light emitting portion and the electron layer.

4. The organic light emitting element according to claim 1, wherein the hole layer comprises:
a hole injection layer disposed on the first electrode; and
a hole transporting layer disposed between the hole injection layer and the light emitting layer.

5. The organic light emitting element according to claim 4, wherein the difference of the energy level between that of the hole layer and the red light emitting portion is a difference of energy level between that of the hole transporting layer and the red light emitting portion.

6. The organic light emitting element according to claim 1, wherein the electron layer comprises:
an electron injection layer disposed on the light emitting layer; and
an electron transporting layer disposed between the electron injection layer and the second electrode.

7. The organic light emitting element according to claim 6, wherein the difference of the energy level between that of the red light emitting portion and the electron layer is a difference of an energy level between that of the red light emitting portion and the electron transporting layer.

8. The organic light emitting element according to claim 1, wherein the electron layer is formed by 4,7-diphenyl-1,10-phenanthroline or 1,3,5-tris(1-phenyl-1H-benzimidazol-2-yl)benzene;
the hole layer is formed by 4,4',4"-tris(carbazol-9-yl)-triphenylamine, or N,N-diphenyl-N,N-[(1-naphthalenyl)-1,1'-biphenyl-4,4-diamine (NPD); and
the red light emitting portion is formed by 1,3-bis(carbazol)-9-yl-benzene or 10-hydroxybenzo[H]quinolone.

9. The organic light emitting element according to claim 1, wherein an electron mobility of the red light emitting portion is smaller than an electron mobility of the blue emitting portion.

10. The organic light emitting element according to claim 9, wherein the electron mobility of the red light emitting portion is smaller than $10^{-3}$ cm$^2$/Vs.

11. The organic light emitting element according to claim 1, wherein the second threshold is from 0.4V to 0.6V.

12. The organic light emitting element according to claim 1, wherein an electron mobility of the green emitting portion is smaller than the electron mobility of the blue emitting portion.

13. The organic light emitting element according to claim 12, wherein the electron mobility of the green emitting portion is smaller than $10^{-3}$ cm$^2$/Vs.

14. The organic light emitting element according to claim 1, wherein the fourth threshold is from 0.4V to 0.6V.

15. A display panel, comprising an organic light emitting element;
wherein the organic light emitting element comprises:
a first electrode;
a hole layer disposed on the first electrode;
a light emitting layer disposed on the hole layer and comprising a red light emitting portion, a blue emitting portion and a green emitting portion;
an electron layer disposed on the light emitting layer; and a second electrode disposed on the electron layer;

wherein a difference of an energy level between that of the hole layer and the red light emitting portion and/or a difference of an energy level between that of the red light emitting portion and the electron layer is greater than or equal to a first threshold which is from 0.2 eV to 0.4 eV, and a difference of an energy level between that of the hole layer and the green emitting portion and/or a difference of an energy level between that of the green emitting portion and the electron layer is greater than or equal to a third threshold which is from 0.2 eV to 0.4 eV, so that turn-on voltages of the red light emitting portion, the blue emitting portion and the green emitting portion are close to each other to avoid color shift under low gray scales.

16. A display device, comprising a display panel comprising an organic light emitting element;

wherein the organic light emitting element comprises:

a first electrode;

a hole layer disposed on the first electrode;

a light emitting layer disposed on the hole layer and comprising a red light emitting portion, a blue emitting portion and a green emitting portion;

an electron layer disposed on the light emitting layer; and a second electrode disposed on the electron layer;

wherein a difference of an energy level between that of the hole layer and the red light emitting portion and/or a difference of an energy level between that of the red light emitting portion and the electron layer is greater than or equal to a first threshold which is from 0.2 eV to 0.4 eV, and a difference of an energy level between that of the hole layer and the green emitting portion and/or a difference of an energy level between that of the green emitting portion and the electron layer is greater than or equal to a third threshold which is from 0.2 eV to 0.4 eV, so that turn-on voltages of the red light emitting portion, the blue emitting portion and the green emitting portion are close to each other to avoid color shift under low gray scales.

* * * * *